United States Patent [19]

Weiss

[11] 4,050,797
[45] Sept. 27, 1977

[54] METHOD AND APPARATUS FOR OBTAINING IMAGES OF DIFFERENT COLOR INTENSITIES COMBINATIONS AND RELATIONSHIPS

[76] Inventor: Jean M. Weiss, 50, rue Sebastien Mercier, 75015 Paris, France

[21] Appl. No.: 534,065

[22] Filed: Dec. 18, 1974

[30] Foreign Application Priority Data

Dec. 27, 1973 France .............................. 73.46640
Dec. 12, 1974 France .............................. 74.37326

[51] Int. Cl.² ............................................ G03B 21/00
[52] U.S. Cl. .................................. 353/30; 353/31; 353/84; 353/121; 352/66; 355/4; 355/88
[58] Field of Search ..................................... 353/30-37, 353/81, 84, 85, 121, 97, 122; 240/92, 93, 2 M, 3.1, 44.2; 352/87, 66, 67; 350/273, 286, 169-174; 354/1, 68, 117, 123; 355/32, 35, 37, 40, 132, 4, 7, 14, 17, 54, 77, 88, 132

[56] References Cited

U.S. PATENT DOCUMENTS

| 1,070,699 | 8/1913 | Kitsee ............................ 240/3.1 X |
| 1,788,135 | 1/1931 | Tuyman et al. ...................... 353/84 |
| 2,774,276 | 12/1956 | Glasser et al. .................... 350/273 X |
| 2,981,791 | 4/1961 | Dixon ............................. 355/37 X |
| 3,199,402 | 8/1965 | Hunt et al. .......................... 355/37 |
| 3,324,764 | 6/1967 | Attman ............................... 355/4 |
| 3,392,645 | 7/1968 | Neasham ......................... 354/68 X |
| 3,667,841 | 6/1972 | Ross ................................. 353/4 |
| 3,685,899 | 8/1972 | Reeds, Jr. ........................... 355/22 |
| 3,715,962 | 2/1973 | Yost, Jr. ............................ 354/68 |
| 3,741,649 | 6/1973 | Podesta et al. ..................... 355/88 |
| 3,836,244 | 9/1974 | Lehman .............................. 355/4 |
| 3,914,721 | 10/1975 | Pollock .......................... 355/88 X |

Primary Examiner—Richard E. Aegerter
Assistant Examiner—John W. Shepperd
Attorney, Agent, or Firm—Lewis H. Eslinger

[57] ABSTRACT

A method of obtaining images of different color intensities, combinations and relationships using at least two information images produced from a master image comprises, in one method cycle, positioning at least two information images successively in the same position, illuminating each information image with light flashes of a color selected from at least two primary colors and synchronising the resulting successive effects.

The invention also includes an apparatus suitable for use with this method.

4 Claims, 3 Drawing Figures

METHOD AND APPARATUS FOR OBTAINING IMAGES OF DIFFERENT COLOR INTENSITIES COMBINATIONS AND RELATIONSHIPS

BACKGROUND OF THE INVENTION

This invention relates to a method and an apparatus for producing a plurality of images, whose colour relationships, combinations and intensities can be all different from one another for each image, there being in practice an almost infinite number of such pictures, all being obtained from a single starting picture.

This method therefore enables a print, a drawing, a slide, or generally a picture of any structure to be given every possible gradation in an infinity of variations of different colour combinations.

This method is particularly suitable for printing on fabrics, paper or plastics. It is also suitable for process engravers, art-workers and creative advertising artists, designers, weavers, tapestry makers, and colleges and institutes of applied arts. It may also be applied to the cinema.

SUMMARY OF THE INVENTION

It is an object of the invention, as compared with prior-art printing techniques, that the method according to the invention does away with the need for successive runs on machines requiring repeated washing and long periods of immobilisation of the equipment used.

According to a first aspect of the invention there is provided a method of obtaining images of different colour intensities combinations and relationships using at least two information images produced from a master image, comprising in one method cycle, the steps of positioning at least two information images successively in the same position, illuminating each said information image when in said position by light flashes of coloured light selected from at least two primary colours and synthesizing the resulting successive effects.

According to a second aspect of the invention there is provided an apparatus for obtaining images of different colour intensities combinations and relationships using at least two information images produced from a master image, comprising transport means for successively transporting information images to the same position, illuminating means for illuminating such a position by flashes of light of one of a plurality of primary colours and means for synchronising said transport means and said illuminating means.

BRIEF DESCRIPTION OF THE DRAWINGS

The invention will now be described in greater detail by way of example, with reference to the drawings in which.

DESCRIPTION OF THE PREFERRED EMBODIMENTS

Figure 1:
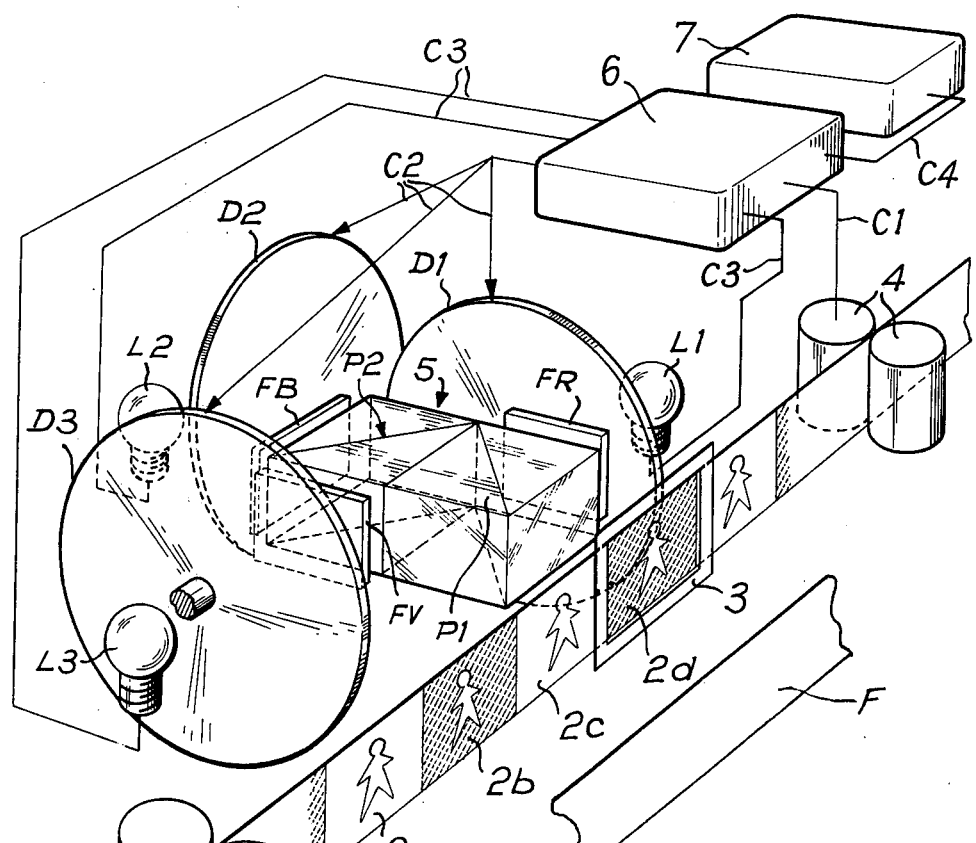
FIG. 1 is a diagrammatic perspective view of a first embodiment of the apparatus according to the invention for use in a three-colour work.

Basically the invention proposes a method comprising:

a. Producing at least two information images from a master image by any known selection process, b. Successively placing at least two information images in the same position and synchronously illuminating each information image when in the said position with a colour slected from at least two primary colours, during a basic cycle of the method and, c. Synthesizing the resulting successive unitary effects.

This method as stated above with respect to its basic cycle, is very general and it will readily be seen that a practically unlimited number of resultant images, all different from one another can be produced by additive synthesis by selecting at will the number of information images used, the number of primary colours used, which will preferably be three (three-colour work) or four (four-colour work), by varying such numbers and also, during successive basic cycles, selecting all the possible combinations of information images and synchronous differently coloured illuminations. The number is increased still further if, according to another feature of the method, the intensity of the synchronous colour illuminations is modulated by successive information images.

The master image taken as a basis for the method according to the invention may be any image on any support (film, transparency, paper etc.) or alternatively a real image as it exists from reality observed. In every case this image is finally characterised by the most varied imaginable outlines and colour shades and intensities.

According to the first stage of the method, a master image of this kind is used to produce at least two information images (in practice between two and ten, for example) by any known process such as negative or positive printing or partial use of such negative or positive printing, or alternatively by three-colour or four-colour selection, or by any trick image process (masks and counter-masks), and so on.

These information images will preferably be carried on a common movable image carrier (a strip or disc).

A programme will provide sychronisation of the successive location of at least two information images and their synchronous illumination with intensities selected from a number of possible intensity levels in one of a number of primary colours (three or four) during a basic cycle of the method.

During a succession of basic cycles this programme will also provide variation of the information images used and of the colours and colour intensities used in synchronism therewith.

Each basic cycle will give a succession of unitary effects and the synthesis of the successive unitary effects will provide the desired final effect.

This synthesis may be effected by the observer's eye by the persistence of vision phenomenon, in which case the appearance of the unitary effects must taken place at the minimum frequency of six images per second as is known.

Alternatively, such synthesis may be effected on an image carrier, for example a colour-sensitive film, in which case the frequency of occurrence of the unitary effects may be at absolutely any value.

Apparatus suitable for performing the method, is also proposed and comprises basically:

a. means for successively transporting separate information images to the same position;

b. means for illuminating such position by flashes in one of a plurality of primary colours and c. means for synchronising the said information image transport means and the said flash illumination means.

This basic generic apparatus is completed by various other means depending upon the types of application.

The apparatus shown in FIG. 1 comprises means for the transport of a film 1 step by step through a gate, the said film bearing separate information images 2a, 2b, 2c etc., previously produced from a master image by any known selection method. The film transport means are illustrated diagrammatically in the drawing in the form of a pair of rollers 4 driven by a stepping motor.

Said means could alternatively be a system of known type comprising claws and counter claws, or any other system of similar kind.

An optical synthesis unit 5 for example of the known prism type, is disposed behind the window 3 and is situated on its axis. In this example, the unit is designed for three-colour work.

In this way, any of three flash lamps L1, L2 or L3, disposed respectively opposite the right-hand face of the first cube of the optical unit, and the rear face and lefthand face of the section cube of the unit, can illuminate the window 3 respectively by reflection in prism P1 in the case of lamp L1, directly through the unit 5 in the case of lamp L2, and by reflection in prism P2 in the case of lamp L3, when the lamp L1, L2 or L3 emits a flash of light.

Three units each comprising a light intensity control disc D1, D2 or D3 and a red, blue and green filter FR, FB and FV respectively, are disposed between each lamp L1, L2 or L3 and the corresponding facing surface of the optical unit.

The discs D1, D2 and D3 may be discs of known type providing variable intensity control along disc sectors. Alternatively, they may each comprise a fixed disc and a moving disc, which together form a polarising filter.

Alternatively, according to a variant, the light intensity control provided by these devices could be provided by the use of known electronic means directly controlling the intensity of the light flashes emitted by the lamps L1, L2 and L3, in which case the discs D1, D2 and D3 or similar devices would no longer be required. The said electronic means can act to vary the power supplied to each lamp and convert it to flashes, the duration and frequency of said flashes being constant. The use of flash lamps has been found very advantageous because, unlike continuously emitting lamps, even if their illumination intensity varies, their colour temperature is constant and their emission is uniform throughout the colour spectrum.

Reference 6 diagrammatically indicates a programming unit, the functions of which are as follows:

The film 1 bears a collection of n information images. During a specific basic cycle of the method, a specific combination of p (p n) information image is used. These p information images will pass in succession in any sequence and assume a position behind the window 3. This successive stepwise transport of the information images is controlled by the programmer 6 which controls the film drive means 4 via the control C1.

Also, whenever and information image 2 is the position in window 3, programmer 6 provides a specific intensity control of one or other of the discs D1, D2 or D3 via the diagrammatically indicated controls C2, and also synchronous triggering of the flash of one or other of the lamps L1, L2 or L3 via the diagrammatically indicated controls C3. In accordance with the predetermined programmer control, whenever an information image is in window 3, the said information image 2 will be illuminated in one or other of the colours: red, blue or green, with a variable intensity. It will readily be apparent that there is already a high number of possible unit effects obtainable from a single information image depending upon all the possible colour and intensity combinations selected. Since each basic cycle also includes the successive production of p unit any effects, the still greater number of possible effects obtained by synthesizing the unitary effects will readily been seen.

Programmer 6 is also intended to control the progress of the successive base cycles.

As already indicated previously, the final synthesis effect of a basic cycle can be observed with the eye directly by viewing the window 3 or by projecting on to a screen (not shown) what appears in the said window. The basic cycle synthesis effect is produced satisfactorily by persistence of vision provided that the unitary effects occur at the minimum rate of 6 images per second. It would be possible, for example, to increase this frequency to a value of 48 images per second if desired.

The synthesis image form during a basic cycle, in the window 3 may alternatively be photographed in colour on strip of film, e.g. the film strip as shown in FIG. 1. These two method of using the apparatus could be used simultaneously.

By way of the diagrammatically illustrated control C4, the programmer may control a recorder 7 which records the results either systematically or as controlled by an observer. These results comprise the complex information which relates the specific combination of p information images used and, for each of them, the colour of the filter used and the light intensity used, to each synthesis picture obtained during a basic cycle.

Figure 2:
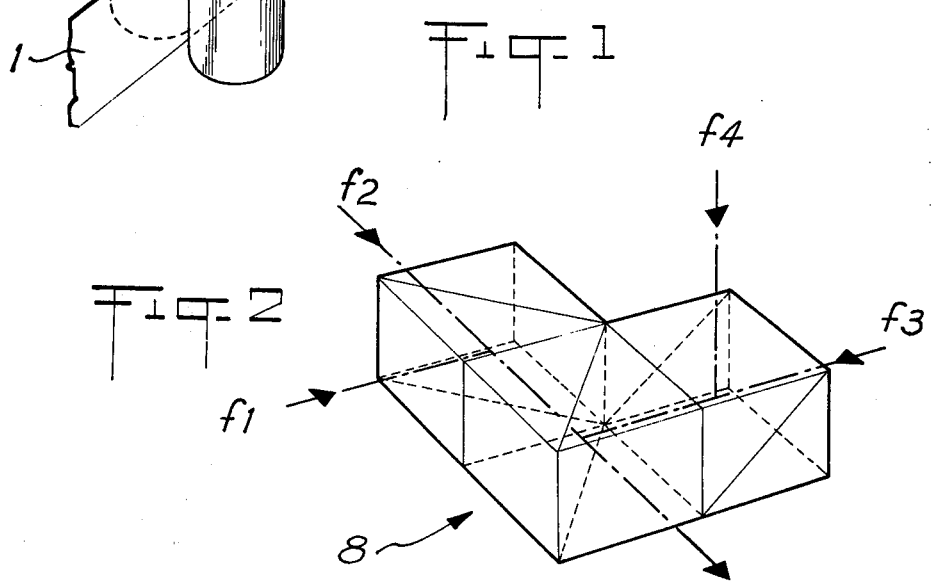
FIG. 2 is a diagram of a variant of a detail of the apparatus illustrated in FIG. 1 and modified for four-colour use.

When it is required to produce an apparatus of the above-described type but for four-colour work, a synthesis optical unit 8 as diagrammatically shown in FIG. 2 will be used. In this case, there will be four lamp-disc-filter systems disposed on three side surfaces of the unit and on the top surface thereof, each such system being able to transmit the light in one of four primary colours and with variable intensity to the window 3 via the optical unit 8 as shown by the paths illustrated by the different arrows f1, f2, f3 and f4 in FIG. 2.

Figure 3:
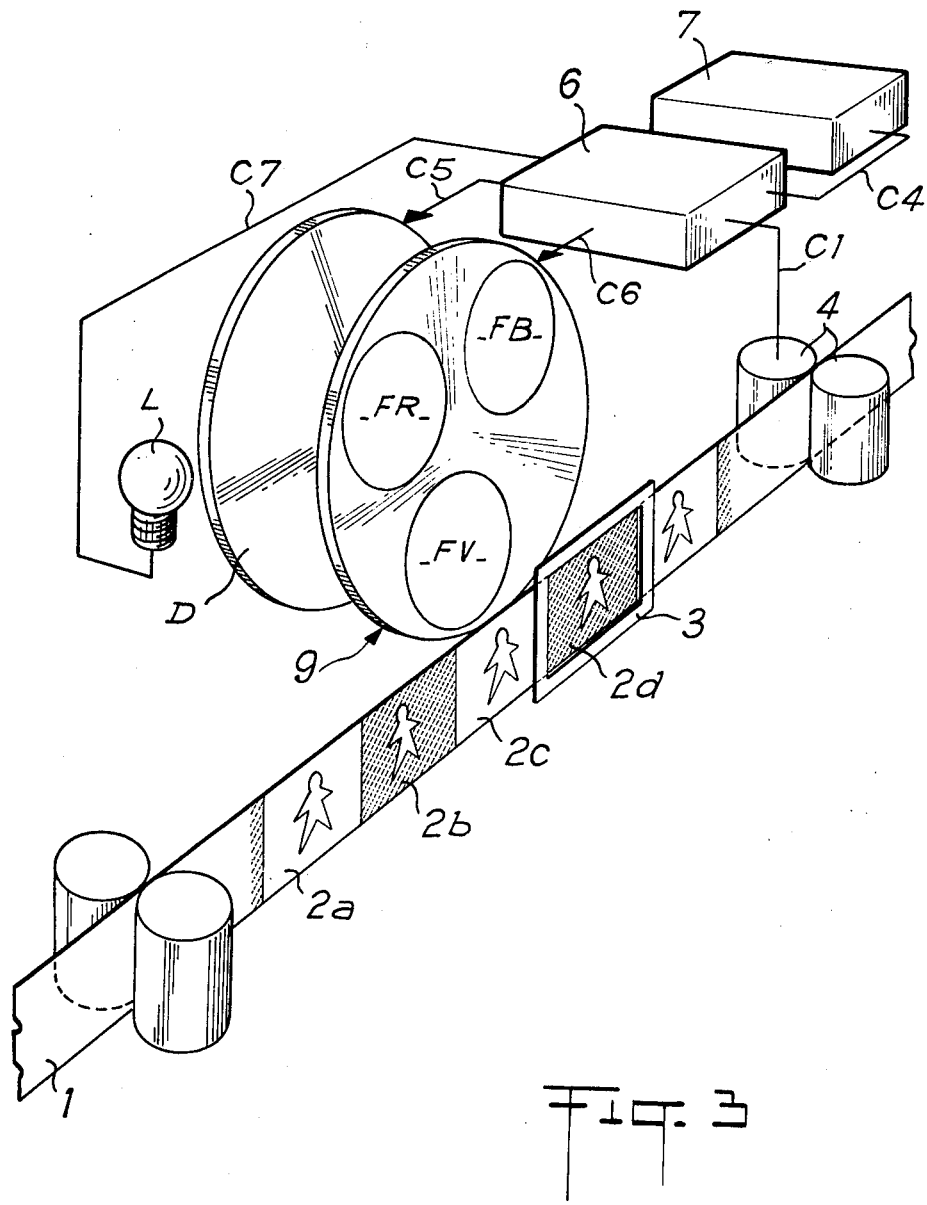
FIG. 3 is a diagrammatic perspective view of a second embodiment of the apparatus according to the invention.

The apparatus shown in FIG. 3 comprises identical elements to some of the elements of the apparatus shown in FIG. 1 and these identical elements have the same reference numeral and their description will not be repeated. The means for illuminating the window 3 comprise a flash lamp L and a support, such as a disc 9, on which primary colour filters are disposed, for example a red filter FR, a blue filter FB and a green filter FV. The disc 9 is rotatable about an axis substantially parallel to the path of the rays of light between the lamp L and the window 3 so that each of the filters FR, FB and FV can be interposed between the lamp L and the window 3 substantially perpendicularly to said path. A light intensity control disc D is interposed, for example between lamp L and disc 9, and is rotatable in a plane parallel to the plane of the disc 9. A movable support other than a disc could be used, more particularly a support in the form of a drum surrounding the lamp L and rotatable about an axis substantially perpendicular to the path of the rays of light between the lamp L and the window 3.

When an information image is in position in the window 3, the programmer 6 controls the intensity of the disc D via a control C6, a primary illumination colour by the position of disc 9 via a control C6, and triggering of the light flash via the control C7.

As a variant, the intensity of illumination by the flashes of lamp L may be controlled by electronic means which directly control the intensity of the flashes emitted by the lamp L, in which case use of the disc D and control C6 would no longer be necessary, the flash intensity and triggering of lamp L then being controlled via control C7.

As another variant, instead of positioning a specific filter in front of lamp L via control C6, the disc 9 could be driven continuously at a speed such that the filters of each of the primary colours borne by the disc 9 all successively pass the lamp L while an information image is in position in window 3, and the triggering of lamp L could be controlled via control C7 so that the lamp L lights only when the filter of the required colour passes it.

It will be understood that there is no limit to the number of primary colours used and, inter alia, white could be added.

It will be understood that the above description of the present invention is susceptible to various modifications, changes and adaptations.

What is claimed is:

1. A method of obtaining a plurality of resultant images reproducing the same pattern with different color intensities, combinations and relationships using at least two different information images each having the same pattern produced from the same master pattern image showing said pattern, said method comprising the steps of
    a. producing at least first and second predetermined information images obtained from said master pattern image
    b. recording said at least first and second information images on respective at least first and second single image storing elements;
    c. successively and repetitively positioning said respective image storing elements at a predetermined position so that said first and second image storing elements are successively and repetitively positioned at said predetermined position;
    d. cyclically performing the steps of snychronously and successively illuminating each of said image storing elements bearing said information images, when the respective storing elements are at said predetermined position, with flashed light of one color selected from at least two primary colors, and superimposing the successive effects resulting from the successive illuminations of the respective image storing elements in order to obtain a resultant image;
    e. said step of positioning said at least first and second storing elements comprising positioning said image storing elements successively in said predetermined position at a rate selected such that the storing element at said position is changed at least six times per second for superimposing said successive effects when seen by the eye, and
    f. varying, during the performance of said cyclically performed steps, at least one of the following parameters; the number of at least one information image, and the color of illumination of at least one information image.

2. A method as claimed in claim 1, further including the step of recording the specific combination of said parameters used during at least one cycle.

3. A method as claimed in claim 2, wherein said superimposition of the successive effects is further carried out on a color sensitive film.

4. A method as claimed in claim 1, wherein said at least two different information images are successively recorded on a single strip of film and, including the step of transporting said film in a stepwise manner synchronously with the illumination of the information images.

* * * * *